United States Patent [19]

Yamamoto et al.

[11] Patent Number: 4,829,340
[45] Date of Patent: May 9, 1989

[54] PICTURE FORMING APPARATUS

[75] Inventors: Takemi Yamamoto; Masashi Ueda, both of Nagoya, Japan

[73] Assignee: Brother Kogyo Kabushiki Kaisha, Nagoya, Japan

[21] Appl. No.: 168,412

[22] Filed: Mar. 15, 1988

[30] Foreign Application Priority Data

Mar. 20, 1987 [JP] Japan .................................. 62-66288

[51] Int. Cl.⁴ ...................... G03B 27/72; G03B 27/76
[52] U.S. Cl. ...................................... 355/35; 355/38; 355/41; 355/71
[58] Field of Search ....................... 355/35, 38, 40, 41, 355/71, 75; 430/138

[56] References Cited

U.S. PATENT DOCUMENTS

| | | | | |
|---|---|---|---|---|
| 3,630,610 | 12/1971 | Klein | ...................................... | 355/71 |
| 3,647,296 | 3/1972 | Long | ...................................... | 355/38 |
| 3,892,482 | 7/1975 | Weisglass | ............................... | 355/71 |
| 4,236,817 | 12/1980 | Hofstetter | ............................... | 355/71 |
| 4,396,281 | 8/1983 | Okabe et al. | ........................... | 355/75 |
| 4,782,365 | 11/1988 | Takagi | .................................... | 355/38 |

Primary Examiner—Monroe H. Hayes
Attorney, Agent, or Firm—Kane,Dalsimer,Sullivan,Kurucz,Levy,Eisele and Richard

[57] ABSTRACT

Disclosed is a picture forming apparatus in which exposure is performed onto a photosensitive medium in accordance with picture information through a light-transmissible medium provided with dot information, the apparatus comprising selectively exposing means for performing the exposure onto a photosensitive medium through a selected one of a plurality of previously prepared light-transmissible media different in dot information from one another, and exposure condition setting means for setting conditions of the exposure in accordance with the dot information of the selected one light-transmissible medium.

9 Claims, 3 Drawing Sheets

PICTURE FORMING APPARATUS

BACKGROUND OF THE INVENTION

1. Field of the Invention

The present invention generally relates to a picture forming apparatus, and particularly relates to a picture forming apparatus in which a photosensitive medium is subject to exposure in accordance with picture information including character information or symbol information through a light-transmissible medium having dot information.

2. Description of the Prior Art

Conventionally, when a picture having good gradation is to be formed on a photosensitive medium such as a photo-pressure sensitive recording sheet having poor gradation, a dot screen having a light-transmissible medium having dot information is used and the photosensitive medium is exposed through the dot screen to thereby obtain a good picture having good gradation on a photosensitive medium.

FIG. 2 shows such a picture forming apparatus using a dot screen. In FIG. 2, light emitted from an exposure light source 1 for exposing a slidefilm 3 is separated into three colors, red, green and blue by a three-color separating filter 2 so that the separated light of red, green, and blue colors is successively incident upon the slidefilm 3. The light transmitted through the slidefilm 3 is condensed by a lens 4 so as to be focused on a photo-pressure sensitive sheet 7 through a dot screen 5. After completion of exposure successively with the separated light of red, green, and blue colors, a developing-sheet feeding roller 11 is driven so as to take up a developing sheet 10 from a developing-sheet cassette 9, and the developing sheet 10 and the photo-pressure sensitive sheet 7 are superposed on each other and passed through pressing rollers 13, so that the image carried by the slidefilm 3 is duplicated on the developing sheet 10. Further, the developing sheet 10 on which the picture has been formed is passed through a heat-fixing rollers 14 so as to improve the coloring and glossiness.

By the use of such an apparatus incorporating a dot screen, a picture having good gradation can be duplicated even on a photosensitive medium, such as a photo-pressure sensitive sheet or the like, having poor gradation property.

However, only a picture formed on a photosensitive medium and having soft tone and good gradation is not always preferable for a user, but there is a case where a picture having poor gradation is more preferable for the user. In this regard, it becomes necessary to remove the dot screen or to replace the dot screen by another one.

Accordingly, such a picture forming apparatus incorporating a dot screen as described above requires much labor because the exposure time or exposure light intensity must be adjusted whenever the dot screen is removed or replaced by another one.

SUMMARY OF THE INVENTION

It is therefore an object of the present invention to solve the problems described above in the prior art.

It is another object of the present invention to provide a picture forming apparatus in which optimum exposure time or exposure light intensity is set even in the case where a light-transmissible medium, such as a dot screen, provided with dot information is removed or replaced by another one, so that a desired picture can be formed on a photosensitive medium without requiring much labor.

In order to attain the above objects, according to an aspect of the present invention, the picture forming apparatus in which exposure is performed onto a photosensitive medium in accordance with picture information through a light-transmissible medium provided with dot information, comprises selectively exposing means for performing the exposure onto a photosensitive medium through a selected one of a plurality of previously prepared light-transmissible media different in dot information from one another, and exposure condition setting means for setting conditions of the exposure in accordance with the dot information of the selected one light-transmissible medium.

According to another aspect of the present invention, the picture forming apparatus in which exposure is performed onto a photosensitive medium in accordance with picture information including character information or symbol information through a light-transmissible medium provided with dot information, comprises detecting means for detecting whether the light-transmissible medium provided with dot information is disposed in a light path of exposure or not, and exposure condition setting means for setting conditions of the exposure in accordance with detection by the detecting means.

In the thus arranged apparatus according to the present invention, preferably, when one of the plurality of previously prepared light-transmissible media is selected, optimum exposure time or optimum exposure light intensity is established in accordance with the dot information carried by the selected light-transmissible medium.

BRIEF DESCRIPTION OF THE DRAWINGS

Other features and advantages of the present invention will be apparent from the following description taken in connection with the accompanying drawings, wherein.

DETAILED DESCRIPTION OF PREFERRED EMBODIMENT

Figure 1:
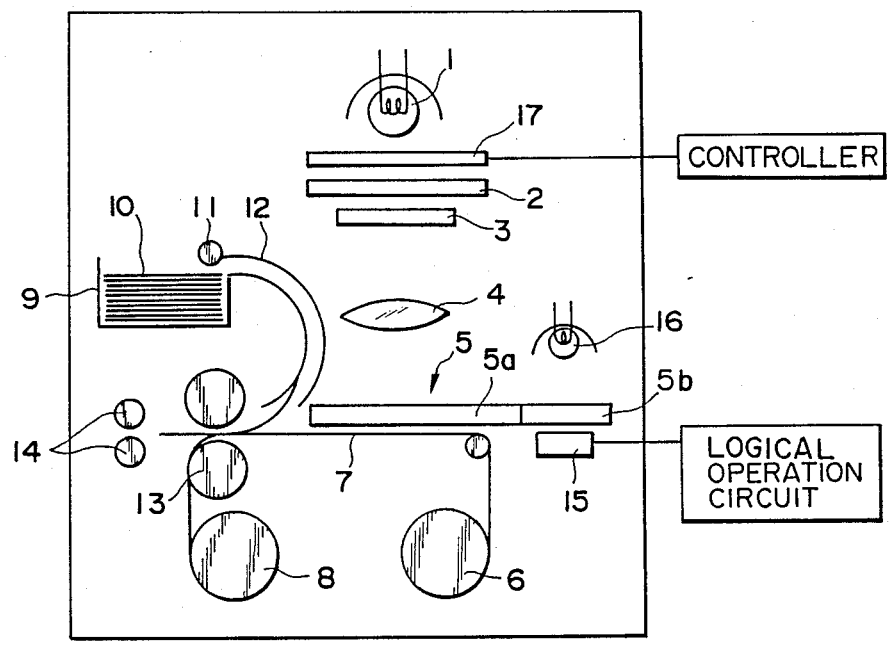
FIG. 1 is a schematic view showing an embodiment of the picture forming apparatus according to the present invention.
Figure 2:
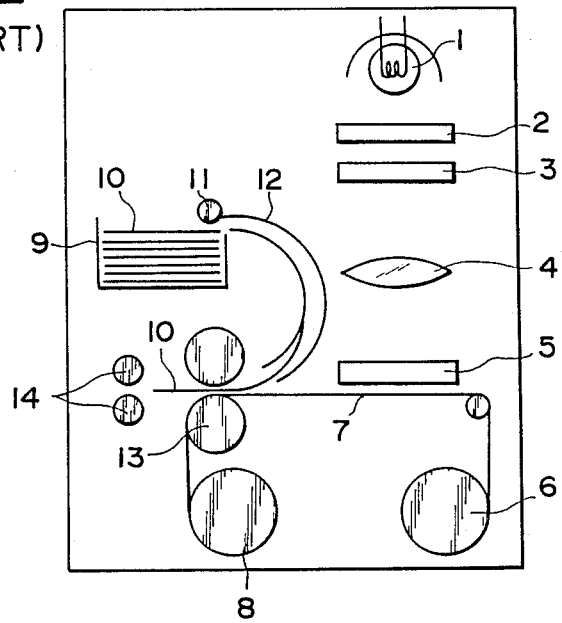
FIG. 2 is a schematic view showing a conventional picture recording apparatus.

Referring to the drawings, an embodiment of the picture forming apparatus according to the present invention will be described hereunder.

The apparatus is provided with a slidefilm-exposing light-source 1, a three-color separating film 2, a slidefilm 3, a condenser 4, a dot screen 5 having a dot screen portion 5a and a dot screen identifying information portion 5b, a photo-pressure sensitive sheet roll cassette 6, a photo-pressure sensitive sheet 7, a photo-pressure sensitive sheet taking-up roller 8, a developing sheet cassette 9, a developing sheet 10, a developing sheet feeding roller 11, a paper feeding guide 12, pressing rollers 13, heat-fixing rollers 14, light detection means 15, a subsidiary light source 16, a shutter 17, a logical operation circuit 20, and a controller 21. In this embodiment, the photosensitive sheet is constituted by, as disclosed in U.S. Pat. No. 4,399,209, The photo-pressure sensitive sheet 7 carrying on its surface microcapsules each of which is sensitive to light to change its mechanical strength and each of which encloses therein a dye precursor, and the developing sheet 10 carrying a developing agent which reacts with the dye precursor within broken ones of the microcapsules. The detailed description as to the arrangement similar to that of the conventional apparatus will be omitted here.

Figure 3:
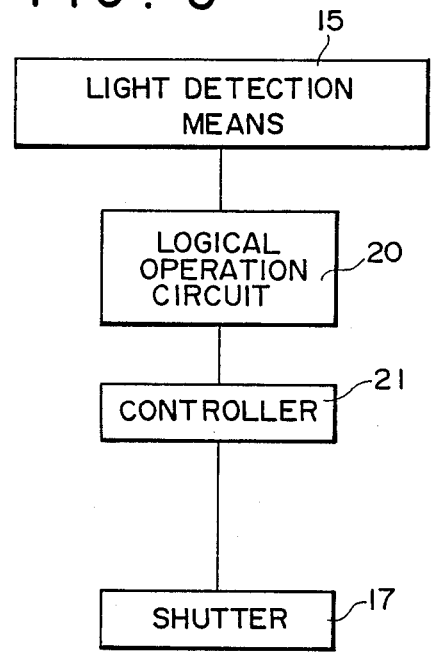
FIG. 3 is a view showing a controlling portion of the embodiment.

Next, means for distinguishing a dot screen or the like and means for controlling a shutter or the like will be described hereunder. The information portion 5b for identifying the dot screen is attached to the dot screen portion 5a at an end portion thereof. Before start of an exposure operation, the subsidiary light source 16 is turned on so that the light from the subsidiary light source passed through the dot screen identifying information portion 5b is irradiated onto the light detection means 15. Thus, the dot screen identifying information carried by the light passed through the dot screen identifying information portion 5b is read by the light detection means 15. As shown in FIG. 3, the dot screen identifying information read by the light detection means 15 is applied to the logical operation circuit 20 so that optimum exposure time is selected in the logical operation circuit 20, and the shutter 17 is controlled by the controller 21 to be opened by the selected optimum exposure time for every color of the light separated by the three-color separating filter 2.

Figure 3A:
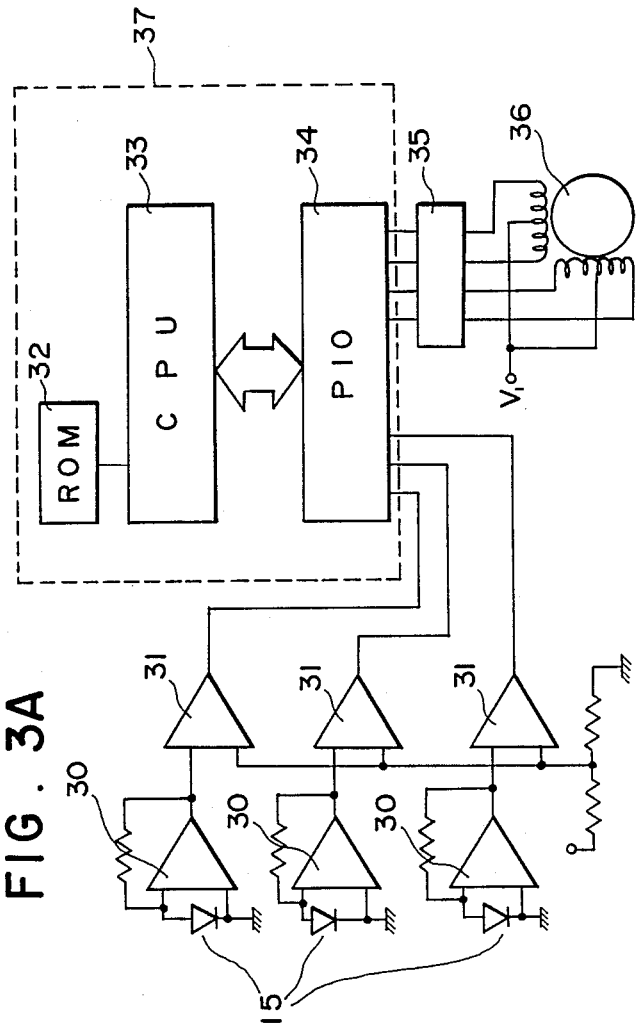
FIG. 3A is a view showing a specific embodiment of the arrangement of FIG. 3 realized with a CPU as the central figure.

FIG. 3A is a view showing a specific embodiment of the arrangement of FIG. 3 realized with a CPU 33 as the central figure. In the circuit arrangement, the information representing the kind of the dot screen is converted into voltage signals through diodes 15 and operational amplifiers 30 and the voltage signals are applied to comparators 31 respectively associated with the operational amplifiers 30 to thereby obtain dot screen information of three bits. Thus, the dot screen information can represent a selected one of 8 kinds of dot screens. The CPU 33 including an ROM 32 reads out the dot screen information through a parallel interface 34. The CPU 33 determines exposure time as a result of operation and outputs a shutter opening/closing signal to a transistor array 35. A shutter-driving stepping motor 36 is controlled in response to an output of the transistor array 35.

In this specific embodiment, the ROM 32, the CPU 33, and the parallel interface 34 are provided as a integrally-provided one-chip microcomputer 37. However, the ROM 32, the CPU 33, and the parallel interface 34 may be provided in a combination of suitable discrete devices. Further, if the number of the diodes 15, the operational amplifiers 30 and the comparators 31 are increased, it is possible to increase the kind of dot screens to be judged.

Figure 4:
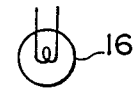
FIG. 4 is a view showing a dot-screen identifying information portion.
Figure 4:
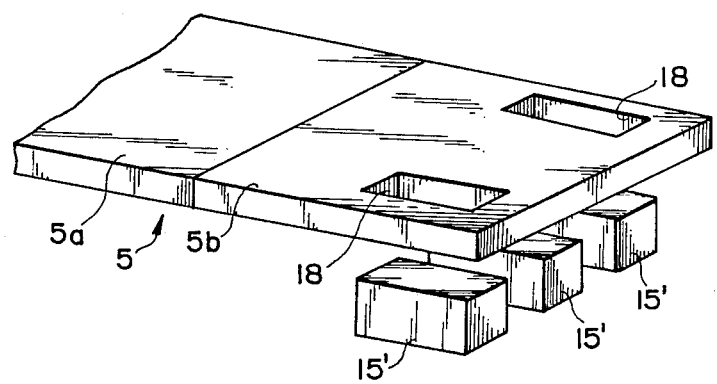

FIG. 4 is a perspective view particularly showing the dot-screen identifying information portion 5b and the light detection means 15. A plurality of holes 18 are formed through the dot screen identifying information portion 5b at positions selected uniquely for every dot screen 5. The light detection means 15 is constituted, for example, by a plurality of photodiodes 15' provided under the dot screen identifying information portion 5b. If the subsidiary light source 16 is turned on, the light is irradiated onto the photodiodes 15' provided just under the holes 18 formed through the dot screen identifying information portion 5b, while the light is not irradiated onto the photodiodes 15 provided just under the positions of the dot screen identifying information portion 5b where no holes 18 are formed. Thus, the dot screen identifying information formed by the holes 18 of the dot screen identifying information portion 5b is read by the photodiodes 15' constituting the light detection means 15, and the respective outputs of all the photodiodes 15' are applied to the logical operation circuit 20. The positions of the holes 18 in one dot screen are uniquely determined, that is, are made different from those of the holes 18 in any other dot screen so that each dot screen can be identified by those holes 18 or can be distinguished from other dot screen by the outputs of the photodiodes 15'.

The operation of the picture forming apparatus will be described hereunder. The slidefilm 3 carrying an image is irradiated with light emitted from the slidefilm-exposing light source 1 and separated by the three-color separating filter 2, and the light transmitted through the image of the slidefilm 3 is focused by the condenser 4 onto the photo-pressure sheet 7 through the dot screen portion 5a to thereby complete the exposure operation. The exposure operation is carried out successively with respect to the light of three colors, red, green and blue separated by the three-color separating film 2. The successive exposure time of the respective light of the three colors is determined by the opening and closing time of the shutter 17 controlled by the controller 21 as described above. After completion of the successive exposure with the respective light of the three colors, the developing sheet feeding roller 11 is driven so as to take out the developing sheet 10 from the developing-sheet cassette 9, the developing sheet 10 and the photo-pressure sensitive sheet 7 are superposed on each other, and the stacked sheets 10 and 7 are passed through the pressing rollers 13, so that the image carried by the slidefilm 3 can be duplicated on the developing sheet 10. Then, the developing sheet 10 on which a picture of the image is formed is passed through the heat fixing rollers 14, so that coloring of the picture is made superior and glossiness of the same is made high. The used photo-pressure sensitive sheet 7 passed through the pressing rollers 13 is wound on the photo-pressure sensitive sheet take-up roller 8 so as to be collected. Thus, it is possible to easily obtain a developing sheet 10 on which a desired picture is formed.

In the embodiment, holes are formed through a dot screen so as to form unique information for identifying the dot screen, and the dot screen identifying information formed by the holes is read by a plurality of photodiodes, so that the exposure time is determined on the basis of the dot screen identifying information read by the plurality of photodiodes. However, the present invention is not limited to the embodiment. For example, protrusions may be formed instead of the holes, and the intensity of exposure light may be controlled instead of the control of the exposure time.

Further, the photosensitive recording medium may be a photo-pressure sensitive recording sheet of the type as disclosed in U.S. Pat. No. 4,440,846 in place of that described in the foregoing embodiment. This photo-pressure sensitive recording sheet carries on its surface microcapsules each of which is sensitive to light to change its mechanical strength and each of which encloses therein a dye precursor, and further carries on its surface a developing agent which reacts with the dye precursor with broken ones of the microcapsules.

As described above, according to the present invention, even if the dot screen is replaced by any other one in order to obtain desired picture quantity, the exposure time or the exposure light intensity is automatically determined so that labor of a user can be saved.

What is claimed is:

1. A picture forming apparatus in which exposure is performed onto a photosensitive medium in accordance with picture information including character information or symbol information through a light-transmissible medium provided with dot information, said apparatus comprising:

selectively exposing means for performing said exposure onto a photosensitive medium through a selected one of a plurality of previously prepared light-transmissible media different in dot information from one another; and exposure condition setting means for setting conditions of said exposure in accordance with the dot information of said selected one light-transmissible medium.

2. A picture forming apparatus according to claim 1, in which said selectively exposing means includes a light source for irradiating a light-transmissible medium having an image, a light separation filter interposed between said light source and said image for separating the light from said light source into a plurality of different light components so as to irradiate said image successively with said light components, a condenser for focusing the light transmitted through said image onto said photosensitive medium to form a picture corresponding said image on said photosensitive medium, a shutter disposed in a light path between said light source and said photosensitive medium, and a controller for controlling opening and closing of said shutter in accordance with said exposure conditions; and in which said exposure condition setting means includes dot information detection means for detecting the dot information of said selected one light-transmissible medium, a logical operation circuit responsive to said dot information detection means for setting said exposure conditions in accordance with the dot information detected by said dot information detection means.

3. A picture forming apparatus according to claim 2, in which each of said plurality of light-transmissible media includes through holes formed at unique positions in said light-transmissible medium for identifying said dot information thereof, and in which said dot information detection means includes a subsidiary light source and light detection means for detecting the light emitted from said subsidiary light source and passed through said holes of said selected one light-transmissible medium to thereby detect said dot information of said selected one light-transmissible medium.

4. A picture forming apparatus according to claim 1, in which said exposure conditions include exposure time for each of said light components.

5. A picture forming apparatus according to claim 1, in which said exposure conditions include exposure light intensity for each of said light components.

6. A picture forming apparatus according to claim 3, in which said light detection means includes a plurality of photodiodes disposed under said selected one light-transmissible medium so that the light passed through said holes of said selected one light-transmissible medium selectively irradiate said plurality of photodiodes so that said dot information of said selected one light-transmissible medium is read by said plurality of photodiodes.

7. A picture forming apparatus in which exposure is performed onto a photosensitive medium in accordance with picture information including character information or symbol information through a light-transmissible medium provided with dot information, said apparatus comprising:

detecting means for detecting whether said light-transmissible medium provided with dot information is disposed in a light path of exposure or not; and exposure condition setting means for setting conditions of said exposure in accordance with detection by said detecting means.

8. A picture forming apparatus according to claim 1 or 7, in which said photosensitive medium is constituted by:

a first recording medium carrying thereon microcapsules each of which encloses a first coloring component and each of which changes in its mechanical strength upon reception of energy; and a second recording medium carrying a second component which changes in color through a reaction with said first coloring component.

9. A picture forming apparatus according to claim 1 or 7, in which said photosensitive medium is constituted by a photopressure sensitive medium carrying thereon:

microcapsules each of which encloses a first coloring component and each of which changes in its mechanical strength upon reception of energy; and a second component which changes in color through a reaction with said first coloring component.

* * * * *